(12) United States Patent
Zahurak et al.

(10) Patent No.: US 9,117,928 B2
(45) Date of Patent: *Aug. 25, 2015

(54) CROSS-POINT DIODE ARRAYS AND METHODS OF MANUFACTURING CROSS-POINT DIODE ARRAYS

(71) Applicant: Micron Technology, Inc., Boise, ID (US)

(72) Inventors: John Zahurak, Eagle, ID (US); Sanh Dang Tang, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/188,536

(22) Filed: Feb. 24, 2014

(65) Prior Publication Data

US 2014/0170822 A1 Jun. 19, 2014

Related U.S. Application Data

(60) Continuation of application No. 13/751,902, filed on Jan. 28, 2013, now Pat. No. 8,659,075, which is a continuation of application No. 13/437,406, filed on Apr. 2, 2012, now Pat. No. 8,362,546, which is a division of application No. 12/635,005, filed on Dec. 10, 2009, now Pat. No. 8,148,222.

(51) Int. Cl.
*H01L 21/336* (2006.01)
*H01L 21/8234* (2006.01)
(Continued)

(52) U.S. Cl.
CPC *H01L 21/823487* (2013.01); *H01L 21/823412* (2013.01); *H01L 21/823418* (2013.01); *H01L 27/105* (2013.01); *H01L 27/24* (2013.01); *H01L 29/66666* (2013.01); *H01L 29/7827* (2013.01)

(58) Field of Classification Search
CPC .............. H01L 21/823412; H01L 21/823418; H01L 21/823487
USPC .................. 438/268, 666; 257/329, 401, 773, 257/E27.07, E29.262, E21.619, E21.621, 257/E21.629
See application file for complete search history.

(56) References Cited

U.S. PATENT DOCUMENTS

| | | |
|---|---|---|
| 6,404,018 B1 | 6/2002 | Wu et al. |
| 6,531,371 B2 | 3/2003 | Hsu et al. |

(Continued)

OTHER PUBLICATIONS

Matsuoka F. et al. "Numerical Analysis of Alpha-Particle-Induced Soft Errors in Floating Channel Type Surrounding Gate Transistor (FC-SGT) DRAM Cell," IEEE Transactions on Electron Devices, vol. 50, No. 7, pp. 1638-1644, Jul. 2003.

(Continued)

*Primary Examiner* — Tu-Tu Ho
(74) *Attorney, Agent, or Firm* — Perkins Coie LLP

(57) ABSTRACT

Methods of forming an array of memory cells and memory cells that have pillars. Individual pillars can have a semiconductor post formed of a bulk semiconductor material and a sacrificial cap on the semiconductor post. Source regions can be between columns of the pillars, and gate lines extend along a column of pillars and are spaced apart from corresponding source regions. Each gate line surrounds a portion of the semiconductor posts along a column of pillars. The sacrificial cap structure can be selectively removed to thereby form self-aligned openings that expose a top portion of corresponding semiconductor posts. Individual drain contacts formed in the self-aligned openings are electrically connected to corresponding semiconductor posts.

20 Claims, 18 Drawing Sheets

(51) Int. Cl.
  *H01L 27/105* (2006.01)
  *H01L 27/24* (2006.01)
  *H01L 29/66* (2006.01)
  *H01L 29/78* (2006.01)

(56) References Cited

U.S. PATENT DOCUMENTS

| | | |
|---|---|---|
| 6,724,029 B2 | 4/2004 | Hsu et al. |
| 6,753,561 B1 | 6/2004 | Rinerson et al. |
| 6,825,058 B2 | 11/2004 | Hsu et al. |
| 6,946,702 B2 | 9/2005 | Jang |
| 7,020,012 B2 | 3/2006 | Rinerson et al. |
| 7,041,598 B2 | 5/2006 | Sharma |
| 7,129,538 B2 | 10/2006 | Lee et al. |
| 7,292,469 B2 | 11/2007 | Lee et al. |
| 7,515,455 B2 | 4/2009 | Nirshl et al. |
| 8,148,222 B2 | 4/2012 | Zahurak et al. |
| 8,362,546 B2 | 1/2013 | Zahurak et al. |
| 2004/0071030 A1 | 4/2004 | Goda et al. |
| 2006/0013042 A1 | 1/2006 | Forbes et al. |
| 2006/0097304 A1 | 5/2006 | Yoon et al. |
| 2006/0258084 A1 | 11/2006 | Tang et al. |
| 2007/0082448 A1* | 4/2007 | Kim et al. ............... 438/268 |
| 2008/0055969 A1 | 3/2008 | Liu |
| 2008/0273363 A1 | 11/2008 | Mouli |
| 2009/0163017 A1 | 6/2009 | Cho |
| 2012/0193703 A1 | 8/2012 | Zahurak et al. |
| 2013/0134503 A1 | 5/2013 | Zahurak et al. |

OTHER PUBLICATIONS

Cho, H.-J. et al. "High Performance Fully and Partially Depleted Poly-Si Surrounding Gate Transistors," 1999 Symposium on VLSI Technology Digest of Technical Papers, pp. 31-32.

International Search Report and Written Opinion for International Application No. PCT/US2010/059362, mailed Aug. 19, 2011, 11 pages.

\* cited by examiner

CROSS-POINT DIODE ARRAYS AND METHODS OF MANUFACTURING CROSS-POINT DIODE ARRAYS

CROSS-REFERENCE TO RELATED APPLICATIONS

This application is a continuation of U.S. application Ser. No. 13/751,902, filed Jan. 28, 2013, now U.S. Pat. No. 8,659,075, which is a continuation of U.S. application Ser. No. 13/437,406 filed Apr. 2, 2012, now U.S. Pat. No. 8,362,546, which is a divisional of U.S. application Ser. No. 12/635,005, filed Dec. 10, 2009, now U.S. Pat. No. 8,148,222, each of which is incorporated herein by reference in its entirety.

TECHNICAL FIELD

The present technology is related to cross-point diode arrays and other types of structures used in memory devices or other types of microelectronic devices, and methods for manufacturing such structures.

BACKGROUND

The microelectronic industry is under intense pressure to produce high performance devices in small package sizes at continually decreasing costs. Smart phones, portable computers, digital cameras, portable music and media players, and many other electronic products require faster memory devices with more capacity. As such, memory device manufacturers in particular seek reliable, low-cost processes for fabricating high-performance devices.

Memory devices may have large arrays of memory cells, and reducing the size of individual memory cells provides a concomitant increase in the bit density of the memory devices. Cross-point memory cells are located in the vertical overlap regions between word lines and bit lines. Cross-point memory cells include structures that undergo a stable and detectable change when exposed to a current between a word line and a corresponding bit line. Because cross-point memory cells are located in the overlap regions between bit lines and word lines, these memory cells may theoretically be formed to extremely small dimensions.

One concern of manufacturing cross-point memory cells is that the smallest features of the structures can be difficult to form using photolithography processes. For example, it is difficult to pattern the wafers to form the drain structures of a cross-point memory cell because these features are so small that they cannot be formed reliably using existing photolithography processes. It is also difficult to photo-pattern gate structures that completely surround the individual pillars in high density cross-point memory arrays. Moreover, it is very expensive to form very small features using photolithography processes because these processes require expensive equipment and materials. Additional concerns of cross-point memory arrays include reversed leakage current, serial resistance, and accurate control of current-voltage uniformity that are important for multi-level cell configurations. Therefore, it is desired to develop improved methods for forming highly integrated circuitry, and in particular cross-point memory cells, and to develop improved circuitry for such features.

DETAILED DESCRIPTION

Specific details of several embodiments of the new technology are described below with reference to memory cell arrays and methods for manufacturing arrays of memory cells. Many embodiments, for example, are directed to cross-point memory arrays used in phase change memory or other types of memory. Memory cells and other semiconductor components are manufactured on and/or in semiconductor wafers that can include semiconductor substrates upon which and/or in which microelectronic devices, micromechanical devices, data storage elements, optics, read/write components, and other features can be fabricated. For example, SRAM, DRAM (e.g., DDR/SDRAM), flash memory (e.g., NAND flash-memory), phase change memory (PCRAM), processors, imagers, light emitting diodes (LEDs) and other types of devices can be constructed on semiconductor wafers. Although many of the embodiments are described below with respect to semiconductor devices that have integrated circuits, other types of devices manufactured on other types of substrates may be within the scope of the new technology. Moreover, several other embodiments of the new technology can have different configurations, components, or procedures than those described in this section. A person of ordinary skill in the art, therefore, will accordingly understand that the new technology may have other embodiments with additional elements, or the new technology may have other embodiments without several of the features shown and described below with reference to FIGS. 1-24.

Figure 1:
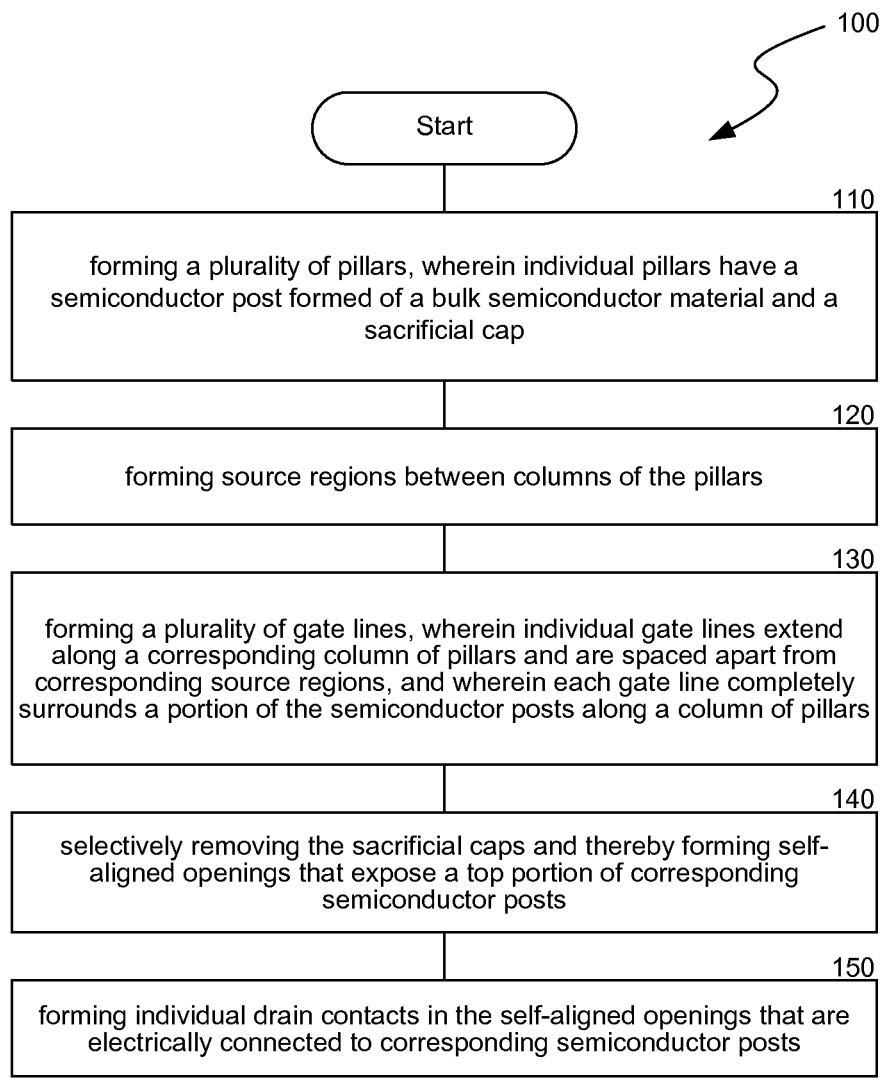
FIG. 1 is flow chart of an embodiment of a method for forming an array of memory cells in accordance with the technology.

FIG. 1 is a flow chart of an embodiment of a method 100 of forming an array of memory cells in accordance with the technology. The method can include forming a plurality of pillars in an array of rows and columns (block 110). The pillars are formed from a substrate of a bulk semiconductor material, and individual pillars have a sacrificial cap structure. For example, individual pillars can have a semiconductor post formed of the bulk semiconductor material and the sacrificial cap structure can be on each of the semiconductor posts. The method further includes forming source regions between columns of the pillars (block 120), and forming conductive gate lines (block 130). Individual gate lines extend along a column of pillars and are spaced apart from corresponding source regions. Each gate line completely surrounds a portion of the semiconductor posts along a corresponding column of pillars. This embodiment of the method 100 further includes selectively removing the sacrificial cap structure and thereby forming self-aligned openings that expose a top portion of corresponding semiconductor posts (block 140), and forming individual drain contacts in the self-aligned openings that are electrically connected to corresponding semiconductor posts (block 150).

Figure 2A:
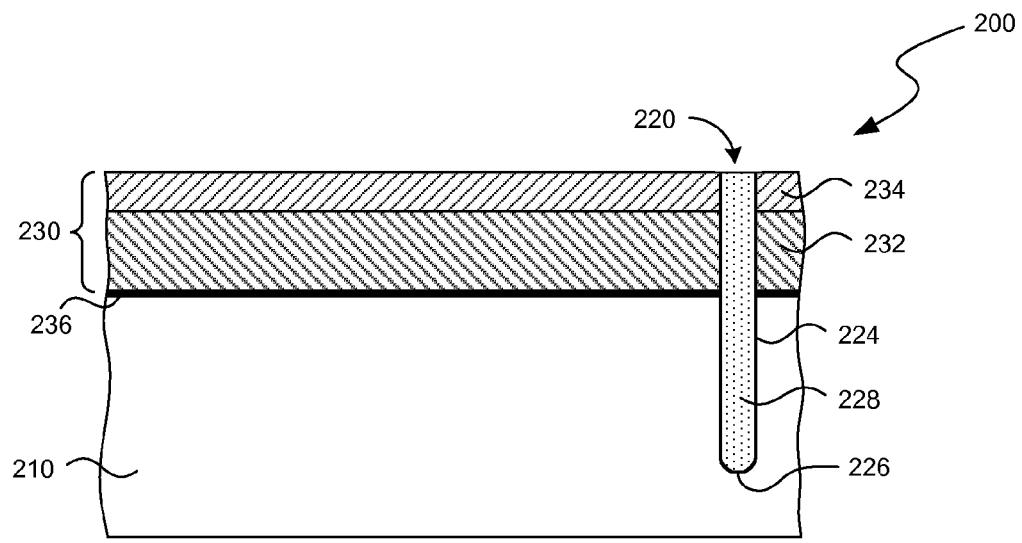
FIG. 2A is a cross-sectional view and FIG. 2B is a top-plan view of an embodiment of a substrate at a stage of a method for forming an array of memory cells in accordance with the technology.
Figure 2B:
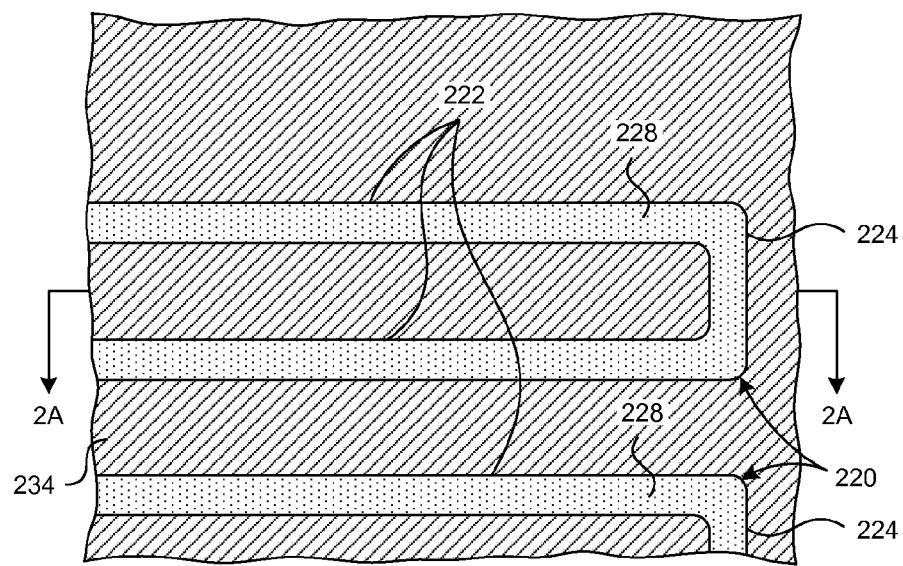

FIGS. 2A and 2B are cross-sectional and top plan views, respectively, of an embodiment of a substrate 200 (e.g., a wafer) at a stage of the method 100. At this stage, the substrate 200 has a bulk semiconductor material 210 (FIG. 2A), a plurality of shallow trench isolation (STI) structures 220, and a sacrificial structure 230 (FIG. 2A). The STI structures 220 can have array trenches 222, peripheral trenches 224, a dielectric liner 226 lining the array and peripheral trenches 222 and 224, and an oxide 228 filling the array and peripheral trenches. The array trenches 222 define the spacing between rows of pillars that form individual memory cells or memory units.

The sacrificial structure 230 can include a first sacrificial material 232 and an optional second sacrificial material 234. The first sacrificial material 232 can be selectively removable relative to the second sacrificial material 234 using a suitable solvent or other material, and the first and second sacrificial material 232 and 234 can also provide separate stop-on features for mechanical removal processes. For example, the first sacrificial material 232 can be a polymeric material and the second sacrificial material 234 can be a nitride. The sacrificial structure 230 can be separated from the bulk semiconductor material 210 by a dielectric layer 236. In one specific embodiment, the dielectric layer 236 can be a silicon oxide layer having a thickness of approximately 50 angstroms, the first sacrificial material 232 can be a polymeric material having a thickness of about 800 angstroms, and the second sacrificial material 234 can be a nitride having a thickness of approximately 400 angstroms.

Figure 3A:
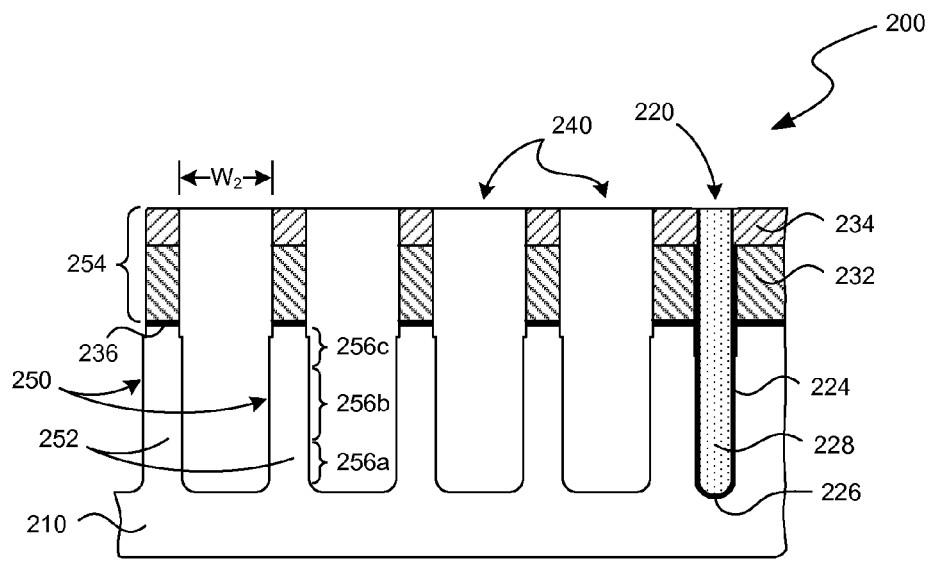
FIG. 3A is a cross-sectional view and FIG. 3B is a top-plan view of an embodiment of a substrate at another stage of a method for forming an array of memory cells in accordance with the technology.
Figure 3B:
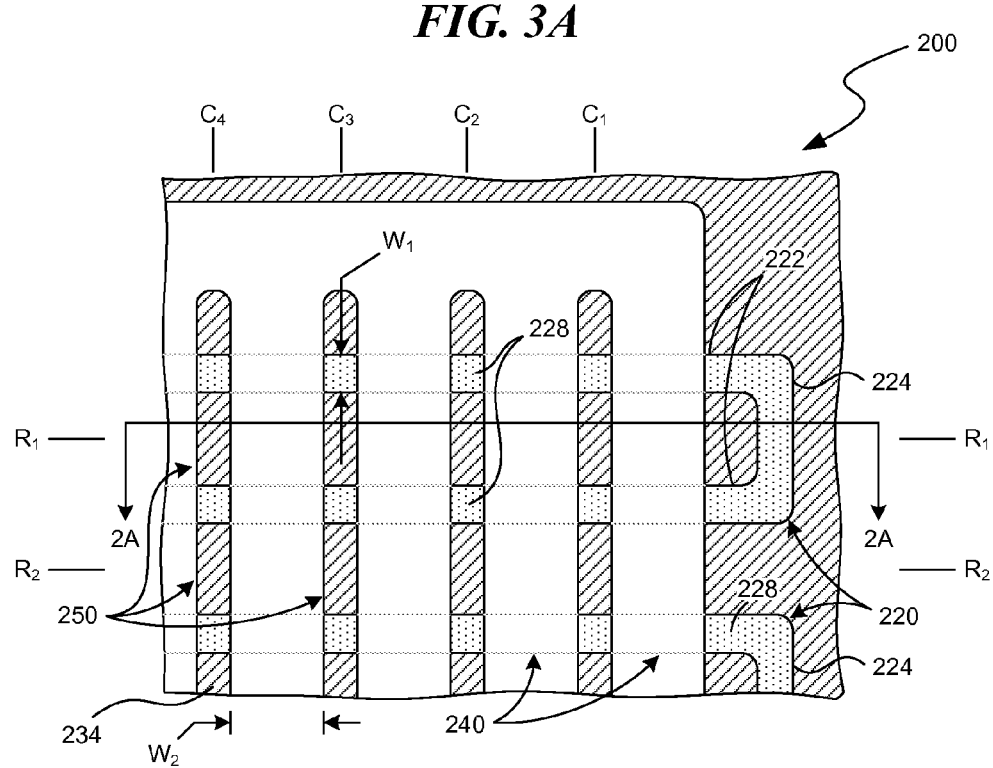

FIGS. 3A and 3B are cross-sectional and top plan views, respectively, of an embodiment of the substrate 200 at a subsequent stage of the method 100 in which column trenches 240 are formed. The column trenches 240 can be perpendicular or at an oblique angle relative to the oxide 228 in the array trenches 222. The column trenches 240 can be formed by photo-patterning a resist or other material (not shown) on top of the sacrificial structure 230 using photolithography or other techniques known in the art. The array trenches 222 can have a first width $W_1$ (FIG. 3B), and the column trenches 240 have a second width $W_2$ greater than the first width $W_1$ of the array trenches 222. The column trenches 240 are formed by etching through the sacrificial structure 230 and into the semiconductor material 210 to a desired trench depth. The etching process can be a dry etch or other method known in the art. In one embodiment, the target trench depth of the column trenches 240 is approximately equal to the depth of the array trenches 222 and peripheral trenches 224 of the STI structure 220.

The substrate 200 has an array of pillars 250 that provide vertical channels for forming individual memory cells. The oxide 228 in the array trenches 222 supports the pillars 250. Referring to FIG. 3A, individual pillars 250 can include a semiconductor post 252 of the bulk semiconductor material 210 and a sacrificial cap 254 formed from the remaining portions of the first and second sacrificial material 232 and 234. The individual semiconductor posts 252 can each include a proximal portion 256a, an intermediate section 256b, and a distal portion 256c relative to the base of the bulk semiconductor material 210 at the bottom of the column trenches 240.

The array of pillars 250 can be arranged in a plurality of rows ($R_1$, $R_2$, etc.) and a plurality of columns ($C_1$, $C_2$, $C_3$, $C_4$, etc.). The rows of pillars 250 are spaced apart from each other by the first width $W_1$ of the array trenches 222, and the columns of pillars 250 are spaced apart from each other by the second width $W_2$ of the column trenches 240. As described in more detail below, the first width $W_1$ and second width $W_2$ are selected based upon the thickness of a conductive gate material such that the resulting conductive gate lines completely surround a portion of each of the pillars 250. The first width $W_1$, for example, can be less than 200% of the thickness of the conductive gate material, and the second width $W_2$ of the column trenches 240 can be greater than 200% of the thickness of the conductive gate material. In more specific embodiments, the second width $W_2$ can be about 300% greater than the thickness of the conductive gate material.

Figure 4A:
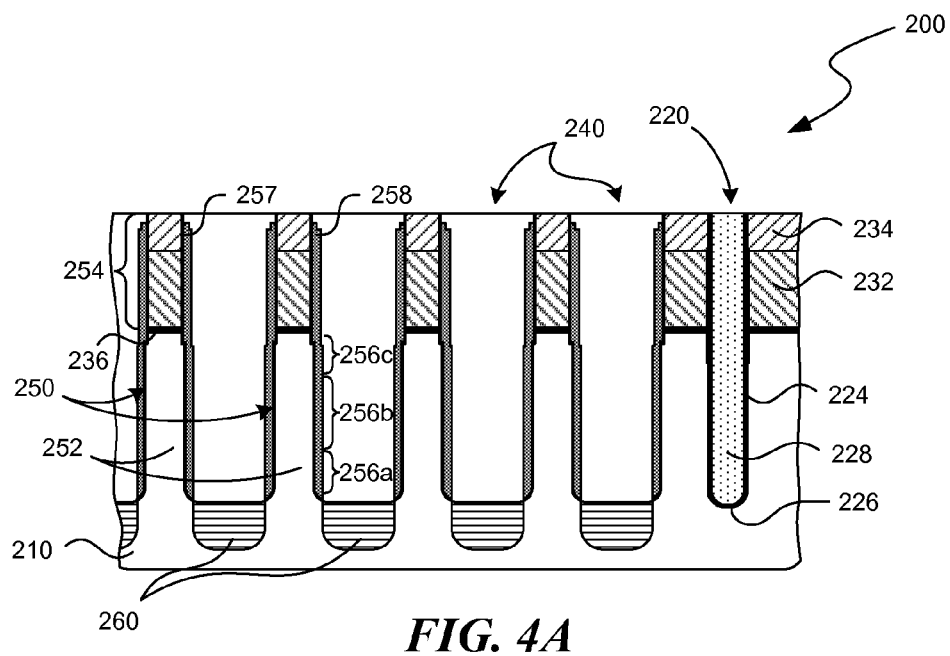
FIG. 4A is a cross-sectional view and FIG. 4B is a top-plan view of an embodiment of a substrate at another stage of a method for forming an array of memory cells in accordance with the technology.
Figure 4B:
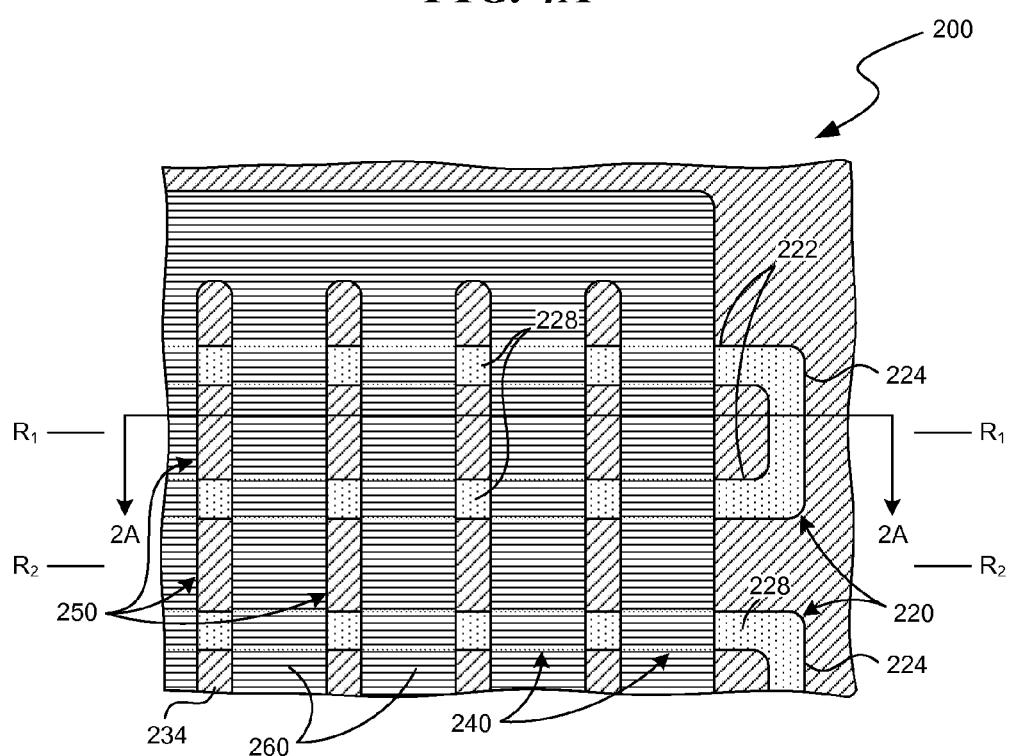

FIGS. 4A-6B illustrate embodiments of the substrate 200 at subsequent stages of the method 100. FIGS. 4A and 4B are cross-sectional and top plan views, respectively, after forming a first dielectric liner 257 and a second dielectric liner 258 along the sidewalls of the pillars 250. The first dielectric liner 257 can be formed by growing an oxide via oxidation, and the second dielectric liner 258 can be formed by growing or otherwise depositing a thin blocking spacer material. For example, the first dielectric liner 257 can be an oxide having a thickness of approximately 20 angstroms, and the second dielectric liner 258 can be a deposited TEOS having a thickness of approximately 50-100 angstroms. The first and second dielectric liners 257 and 258 are then spacer etched to remove the portions of the liners on the top of the pillars 250 and in the bottom of the column trenches 240. The method can further include an activation procedure to re-crystallize the semiconductor material.

Figure 5A:
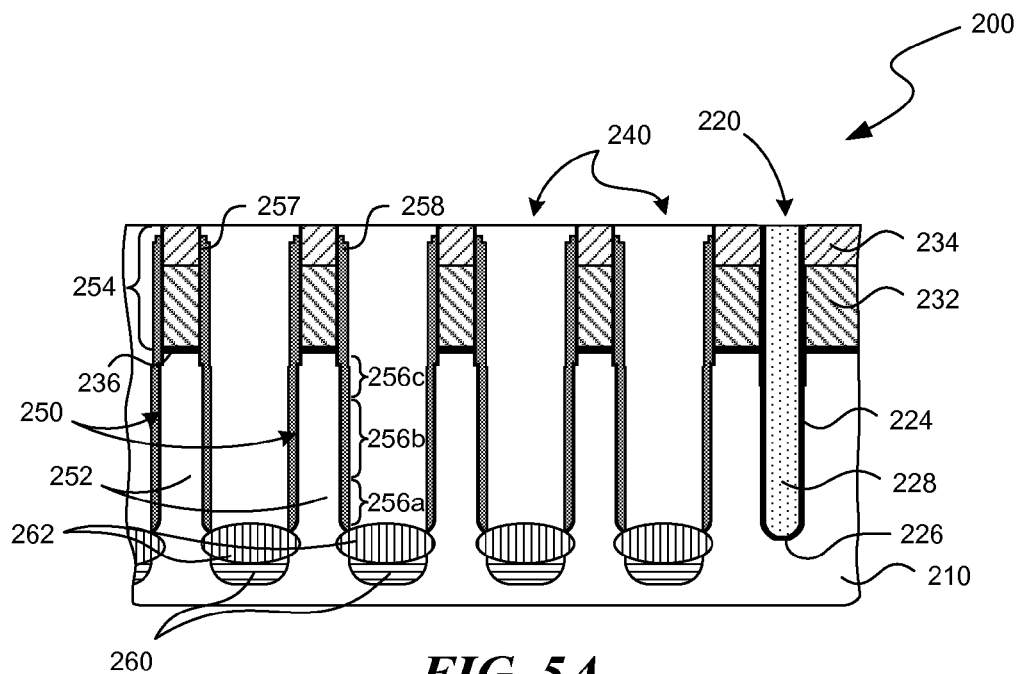
FIG. 5A is a cross-sectional view and FIG. 5B is a top-plan view of an embodiment of a substrate at another stage of a method for forming an array of memory cells in accordance with the technology.
Figure 5B:
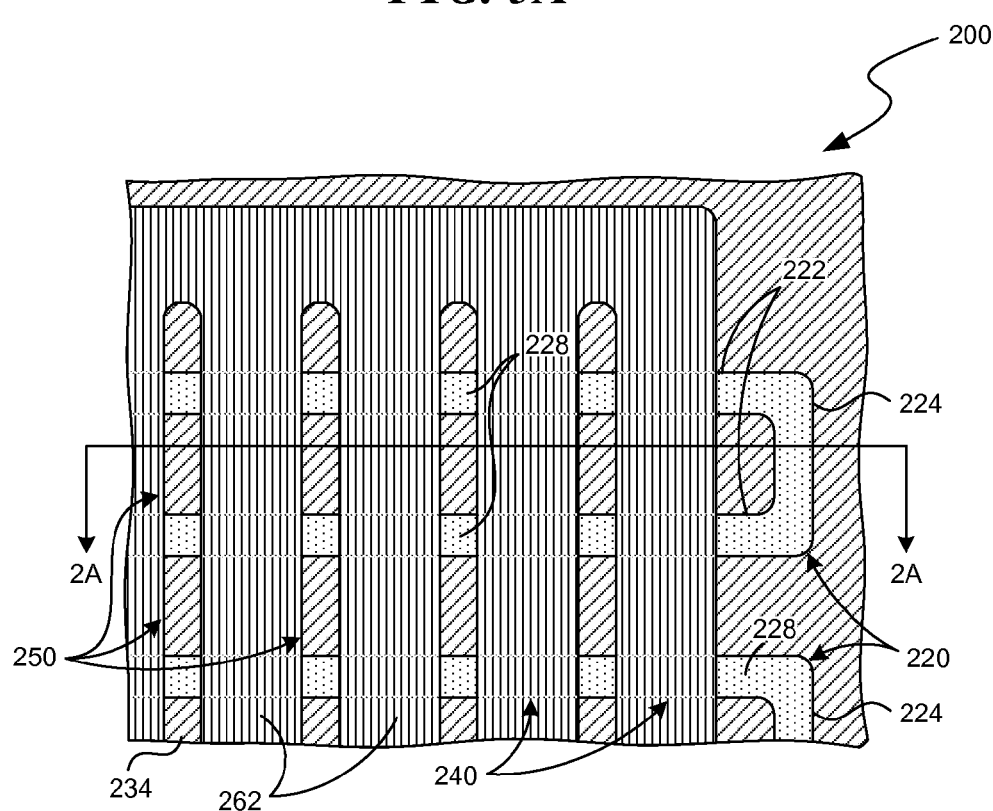

After spacer etching the first and second liners 257 and 258, source regions 260 are formed by implanting the desired implant species into the bulk semiconductor material 210 at the bottom of the column trenches 240. The source regions 260, for example, can be an N-type species. FIGS. 5A and 5B are cross-sectional and top plan views, respectively, of the substrate 200 at a subsequent stage in which a silicide 262 is formed at the source regions 260 by exposing the implanted material to a source, such as Ni, Co, or Ti, that selectively forms a metal silicide. During the silicide process, the sidewalls of the pillars 250 are protected by the second dielectric liner 258 and the second sacrificial material 234 of the cap structure 254. The un-reacted metal can be removed from the silicide 262 with a wet etch or other technique, and a thin nitride liner can be formed to cap the silicide 262

Figure 6A:
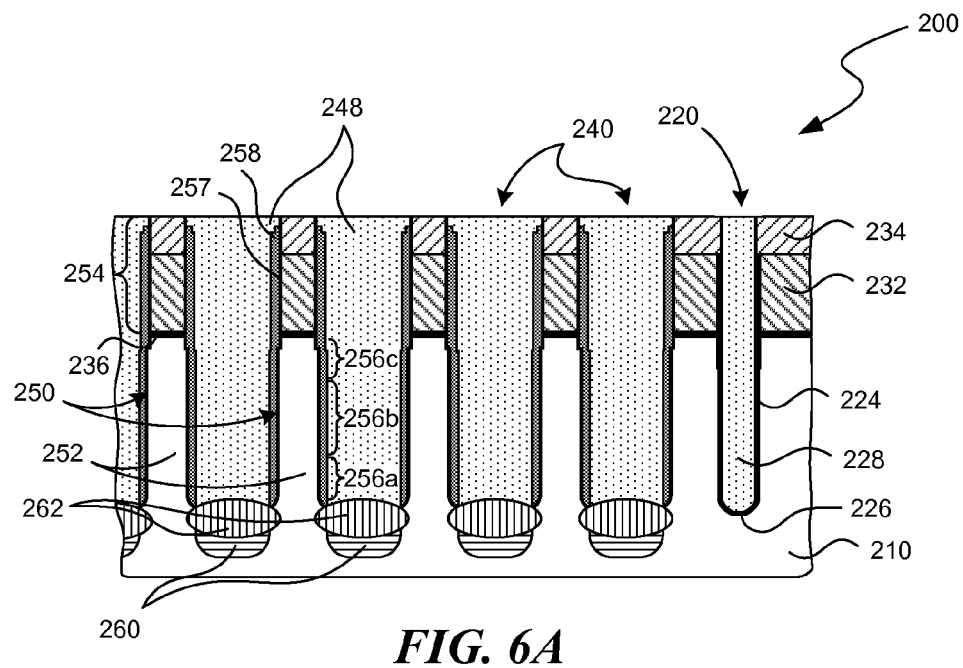
FIG. 6A is a cross-sectional view and FIG. 6B is a top-plan view of an embodiment of a substrate at another stage of a method for forming an array of memory cells in accordance with the technology.
Figure 6B:
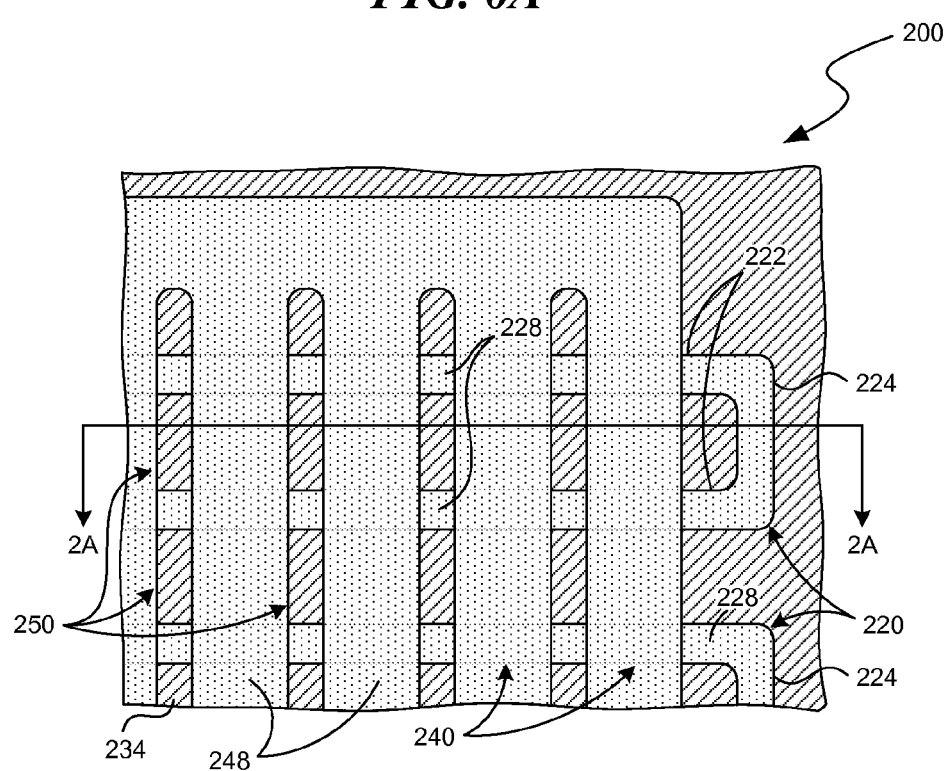

FIGS. 6A and 6B are cross-sectional and top plan views, respectively, of an embodiment of the substrate 200 at a later stage in which the column trenches 240 are filled with an oxide 248 and then planarized using a chemical-mechanical planarization process or other process that stops on the second sacrificial material 234 of the sacrificial cap 254. The oxide 248 that fills the column trenches 240 can be the same as the oxide 228 that fills the array trenches 222 of the STI structure 220. The thin nitride cap deposited on the silicide 262 protects the silicid 262 from subsequent gate oxidation.

Figure 7A:
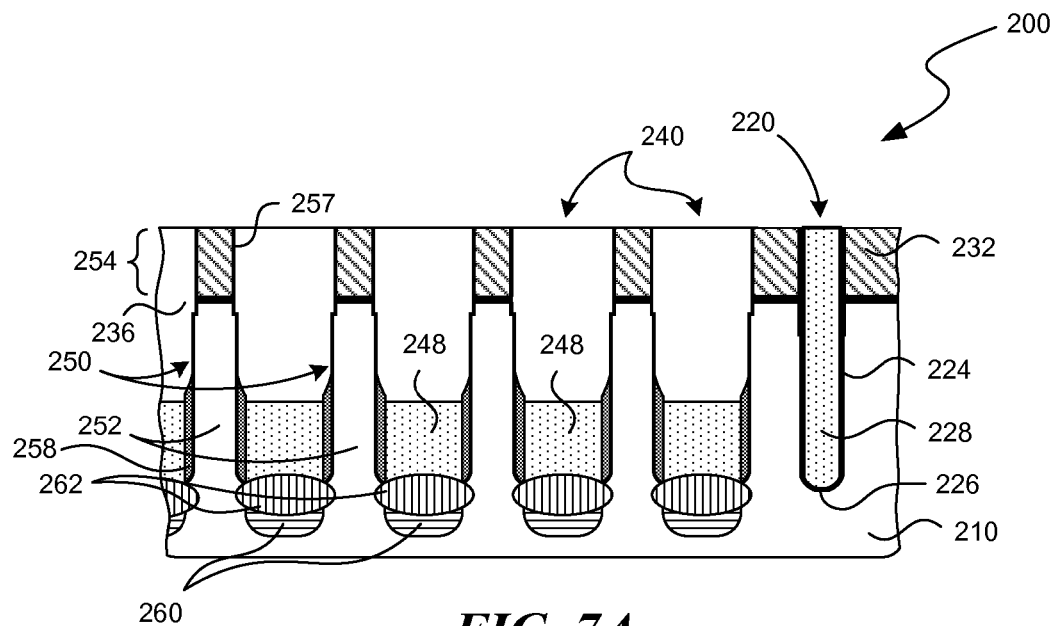
FIG. 7A is a cross-sectional view and FIG. 7B is a top-plan view of an embodiment of a substrate at another stage of a method for forming an array of memory cells in accordance with the technology.
Figure 7B:
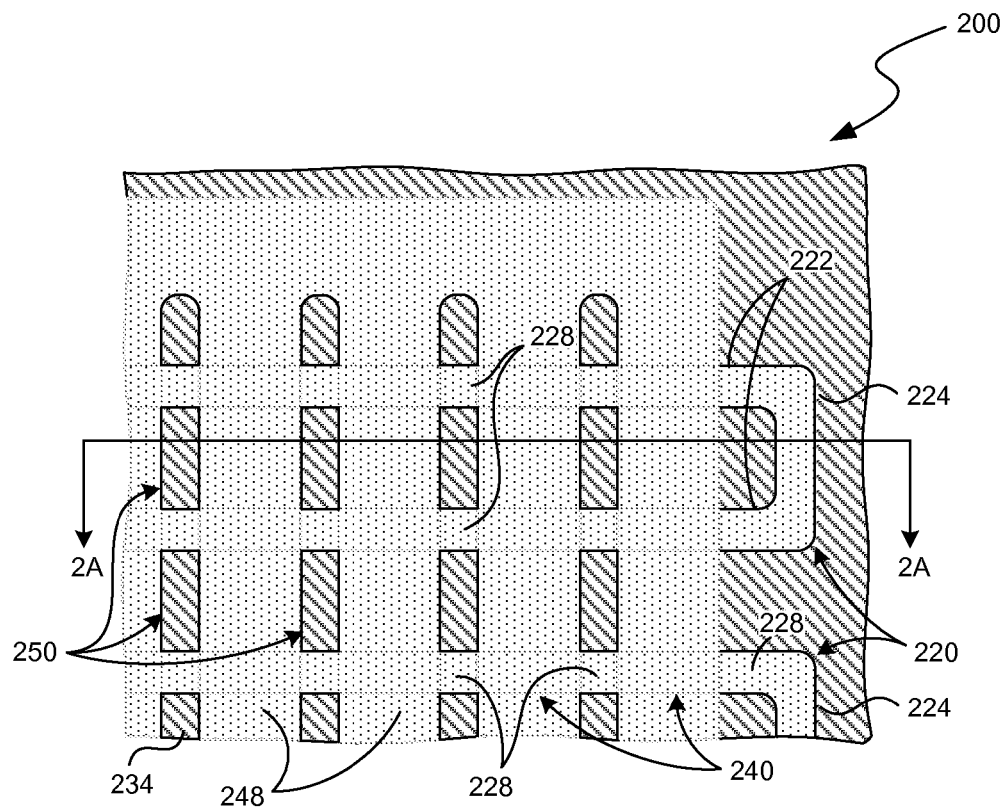

FIGS. 7A-8B illustrate embodiments of additional stages of the method 100. FIGS. 7A and 7B are cross-sectional and top plan views, respectively, of the substrate 200 after removing the second sacrificial material 234 and a portion of the oxides 228 and 248. The second sacrificial material 234 can be selectively removed relative to the oxides 228 and 248 in a separate process, or the second sacrificial material 234 and the oxides 228 and 248 can be removed in the same process. The oxides 228 and 248 are accordingly recessed relative to the distal portion 256c of the semiconductor posts 252. In one embodiment, the thickness of the remaining portions of the oxides 228 and 248 is about 700 angstroms.

Figure 8A:
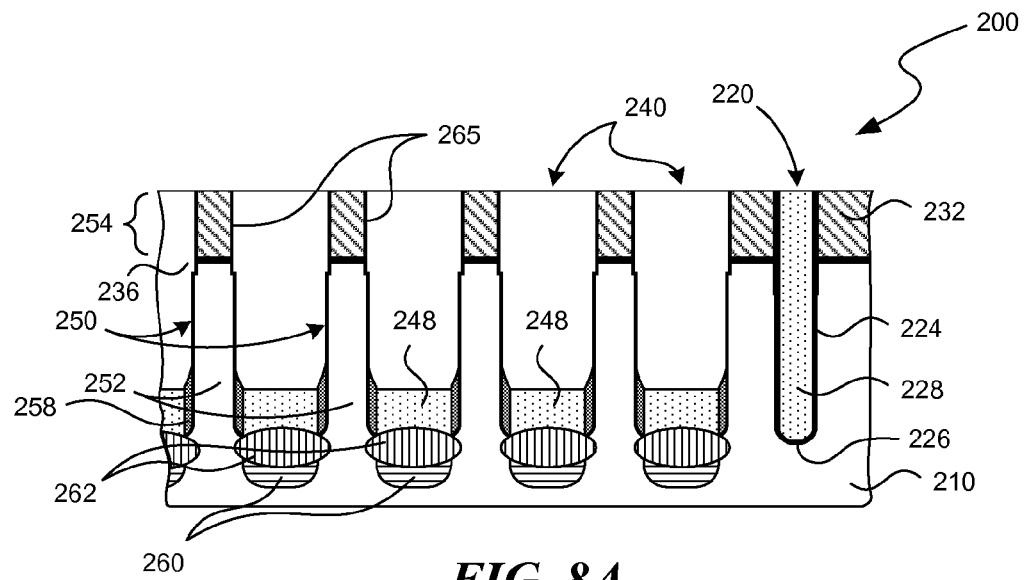
FIG. 8A is a cross-sectional view and FIG. 8B is a top-plan view of an embodiment of a substrate at another stage of a method for forming an array of memory cells in accordance with the technology.
Figure 8B:
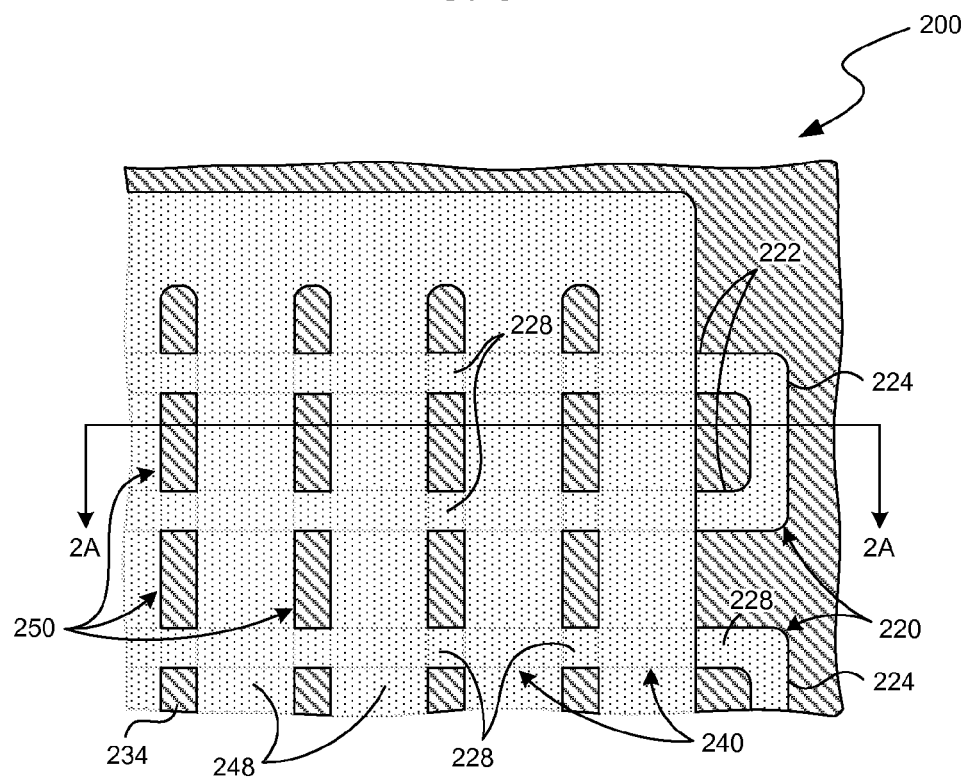

FIGS. 8A and 8B are cross-sectional and top plan views, respectively, illustrating the substrate 200 at a further stage in which more material is removed from the oxides 228 and 248 and the sidewalls of the pillars 250 are cleaned. The remaining portions of the oxides 228 and 248 provide a dielectric spacer between the source regions 260 and the intermediate sections 256b of the semiconductor posts 252 where the metal gates will be formed. In one embodiment, the thickness of the remaining portions of the oxide 228 and 248 is about 200 angstroms. The exposed sidewalls of the semiconductor posts 252 provide a clean semiconductor surface for forming a gate dielectric 265. The gate dielectric 265 can be formed of conventional $SiO_2$, nitride hardened $SiO_2$, or other suitable materials. The portions of the gate dielectric 265 at the intermediate sections 256b of the posts 252 define the gate dielectric for the memory cells.

Figure 9A:
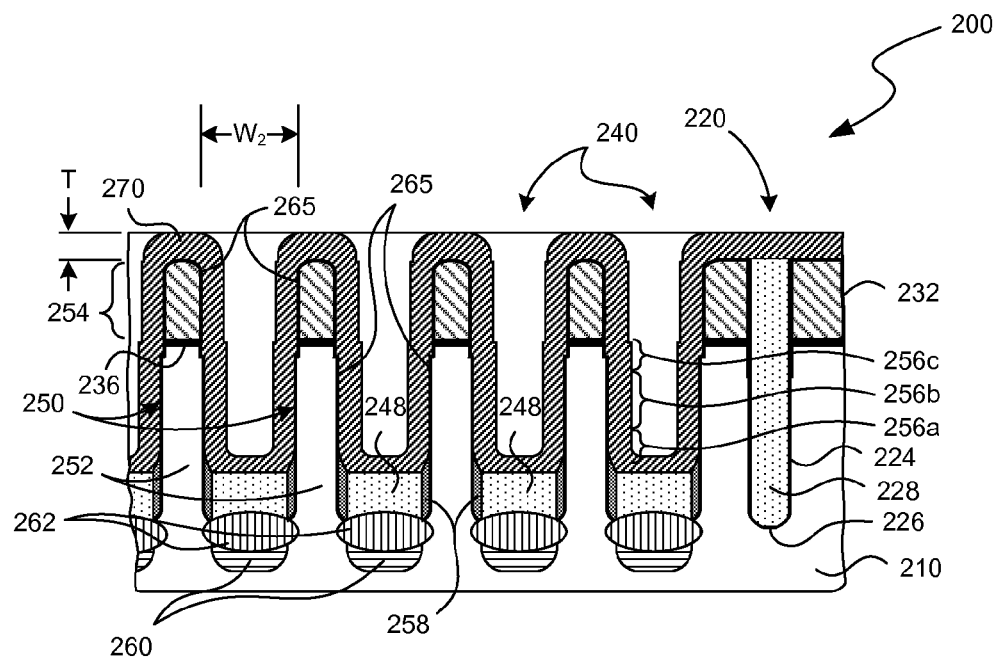
FIGS. 9A and 9B are a cross-sectional views and FIG. 9C is a top-plan view of an embodiment of a substrate at another stage of a method for forming an array of memory cells in accordance with the technology.
Figure 9B:
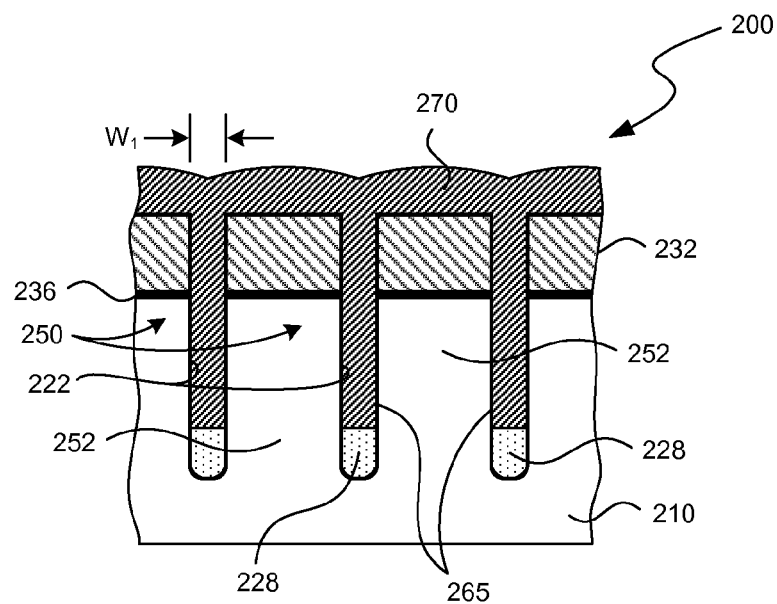
Figure 9C:
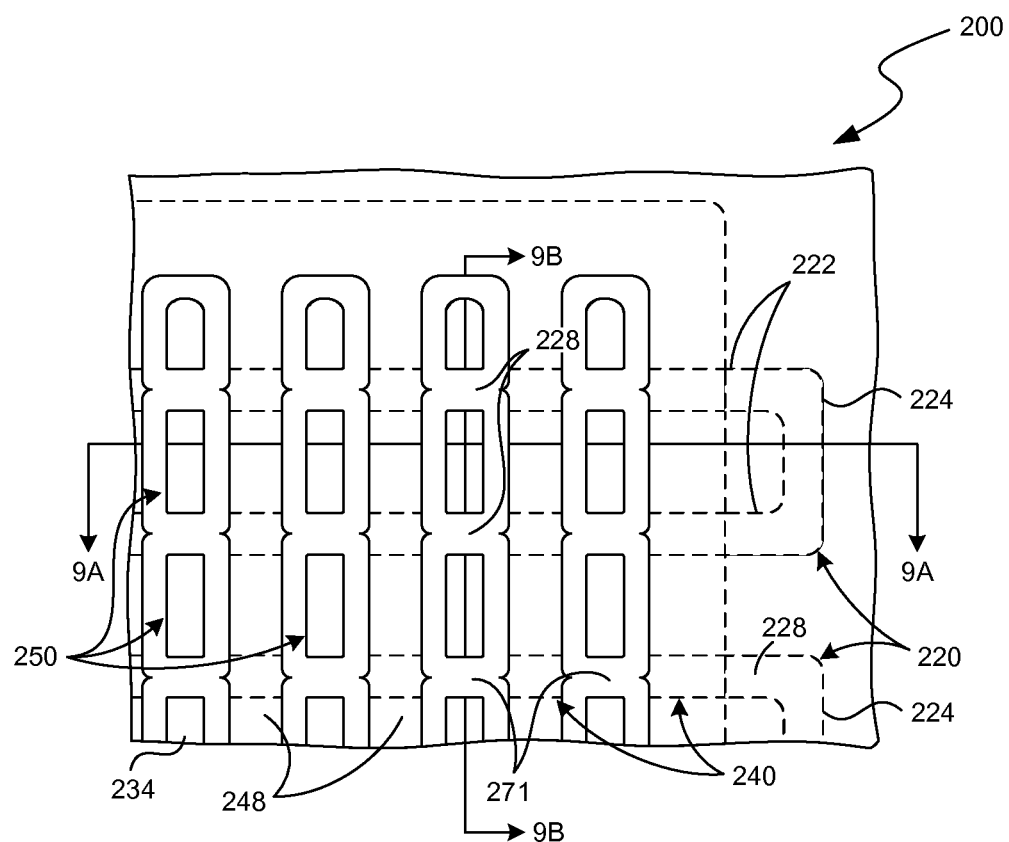

FIGS. 9A-9C illustrate embodiments of the substrate 200 at a metallization stage of the method 100. FIGS. 9A and 9B are cross-sectional views taken along lines 9A-9A and 9B-9B of FIG. 9C. The method further includes depositing a conductive gate material 270 over the pillars 250 and into the recessed portions of the array trenches 222 (FIG. 9B) and the column trenches 240 (FIG. 9A). The gate material 270 has a thickness T (FIG. 9A) such that the smaller first width $W_1$ of the array trenches 222 causes the gate material 270 to pinch off at intersections 271 (FIG. 9C) over the portions of the oxide 228 between rows of pillars 250. The thickness T of the gate material 270, however, is not so thick that it spans the larger second width $W_2$ of the column trenches 240. The gate material 270 can be tantalum nitride or other suitable materials.

Figure 10:
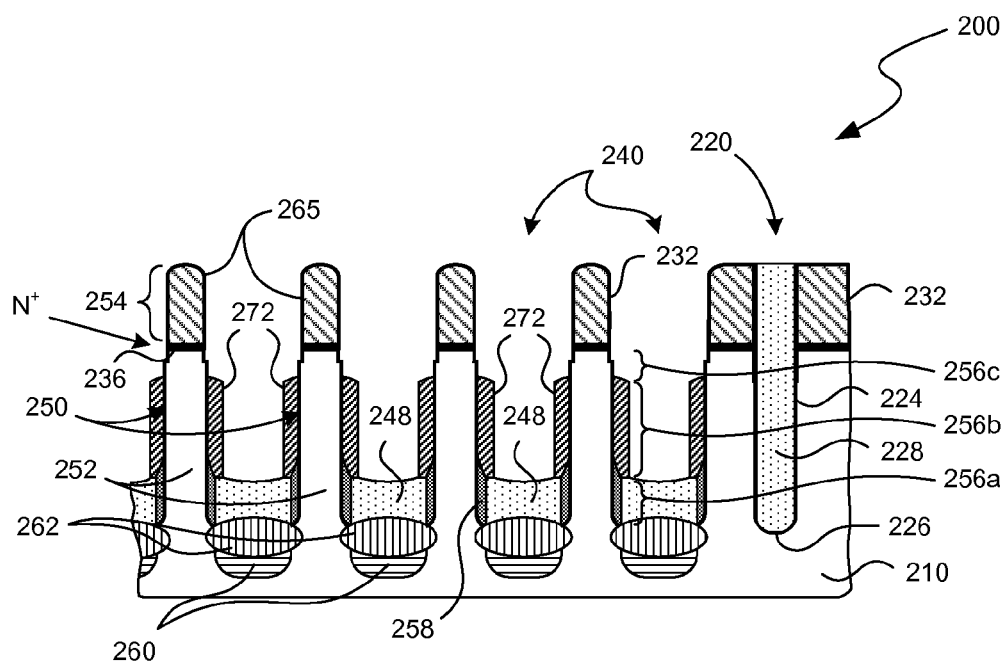
FIG. 10 is a cross-sectional view of an embodiment of a substrate at another stage of a method for forming an array of memory cells in accordance with the technology.

FIG. 10 is a cross-sectional view illustrating embodiments of the substrate 200 at a stage of the method 100 in which gate lines 272 are formed from the gate material 270. The gate lines 272 are formed by spacer etching the gate material 270 (FIGS. 9A-9C) until the remaining portions of the gate material 270 are about at or near the intermediate sections 256b (FIG. 5A) of the semiconductor posts 252. The spacer etch can selectively stop on the oxide 248 at the bottom of the column channels 240. However, because the gate material 270 completely filled the array tranches 222 between pillars 250, a portion of the gate material 270 remains in the bottom of the array trenches 222 between the pillars 250. Each metal gate line 272 accordingly completely surrounds the corresponding intermediate sections 256b of the posts 252 along a column of pillars 250. After forming the gate lines 272, an optional step includes implanting an n-type implant or other species into the distal portions 256c of the semiconductor posts using an angle implant (e.g., an n-type lightly doped drain).

Figure 11:
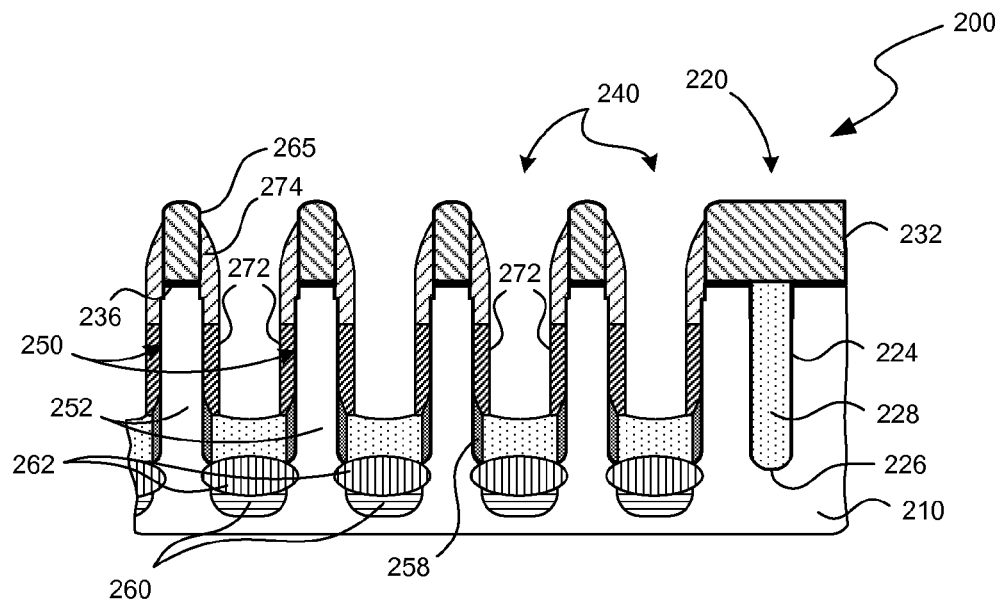
FIG. 11 is a cross-sectional view of an embodiment of a substrate at another stage of a method for forming an array of memory cells in accordance with the technology.

FIG. 11 is a cross-sectional view of embodiments of the substrate 200 at another stage of the method 100. At this stage dielectric spacers 274 are formed above the gate lines 272, along the sidewalls of the pillars 250. The dielectric spacers 274 can be formed by depositing a dielectric material over the substrate and spacer etching the dielectric material to remove it from horizontal or other non-vertical surfaces. The dielectric spacers 274, for example, can be a nitride that is selectively etchable relative to the gate dielectric 265 and the oxide 248 in the bottom of the column channels 240.

Figure 12:
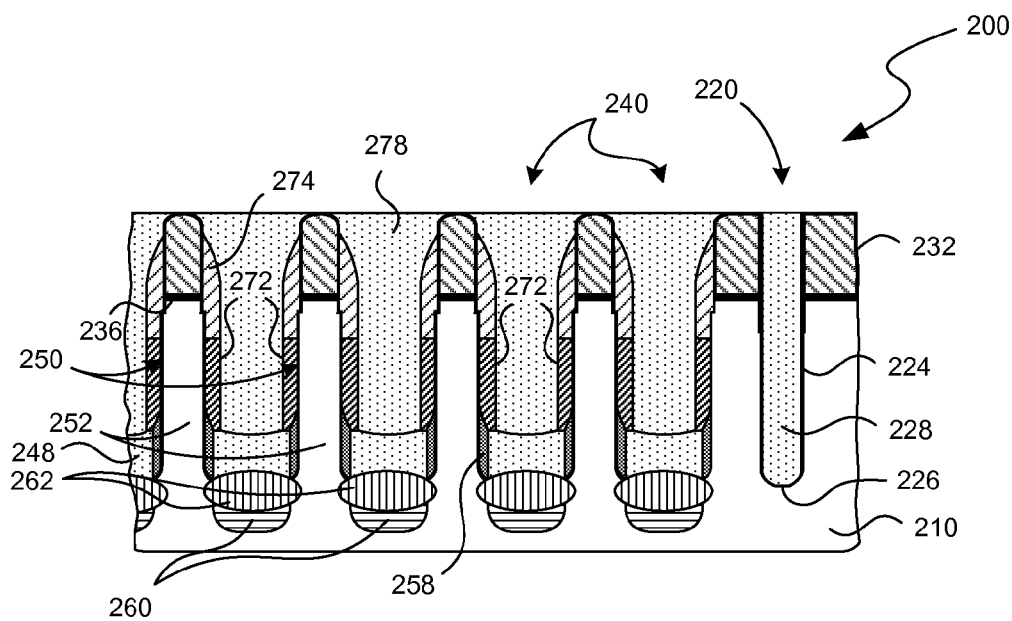
FIG. 12 is a cross-sectional view of an embodiment of a substrate at another stage of a method for forming an array of memory cells in accordance with the technology.

FIG. 12 is a cross-sectional view of embodiments of the substrate 200 at a subsequent stage that includes depositing an oxide 278 into the open portions of the array trenches 222 and the column trenches 240. The oxide 278 can be planarized to remove (a) an over burden of the oxide 278 and (b) the portions of the gate dielectric 265 on top of the remaining portions of the first sacrificial material 232. The planarization procedure accordingly exposes the remaining portions of the first sacrificial dielectric layer 232 without any additional photolithography procedures. As such, the exposed portions of the first sacrificial material 232 over the individual semiconductor posts 252 are "self-aligned" in that a separate photolithography process is not necessary to form a pattern corresponding to the exposed portions of the first sacrificial material 232.

Figure 13:
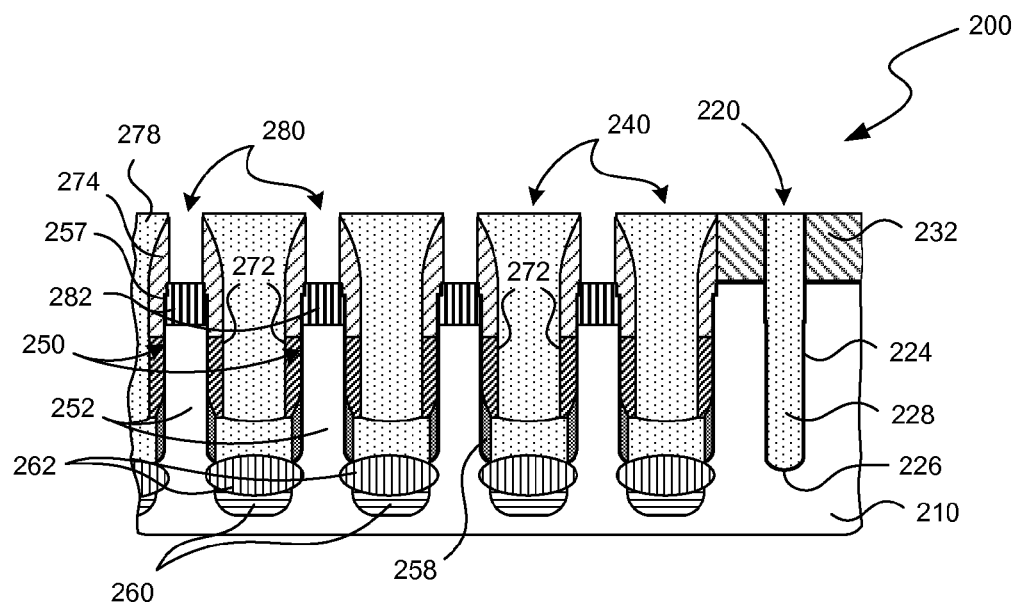
FIG. 13 is a cross-sectional view of an embodiment of a substrate at another stage of a method for forming an array of memory cells in accordance with the technology.

FIG. 13 is a cross-sectional view illustrating embodiments of subsequent stages in which the exposed portions of the first sacrificial material 232 are selectively etched relative to the oxide 278 to form self-aligned openings 280 directly over the distal portions 256c of corresponding semiconductor posts 252. The first sacrificial material 232 is formed from a material that is selectively removable relative to the oxide 278 and the dielectric spacer 274 such that the self-aligned openings 280 can be formed directly over the distal portions 256c of the semiconductor post 252 without having to align openings of a mask with the posts 252 (e.g., a mask photo-patterned on the wafer to have openings aligned with the posts). An n-type or other species can be implanted into the distal portions 256c of the semiconductor posts 252 to form drain regions 282. The drain regions 282 can accordingly be formed by directly implanting the implant species through the openings 280 at this stage of the process either in lieu of or in addition to forming the drain regions 282 earlier in the method using an angled implant process as described above with respect to in FIG. 10.

Figure 14:
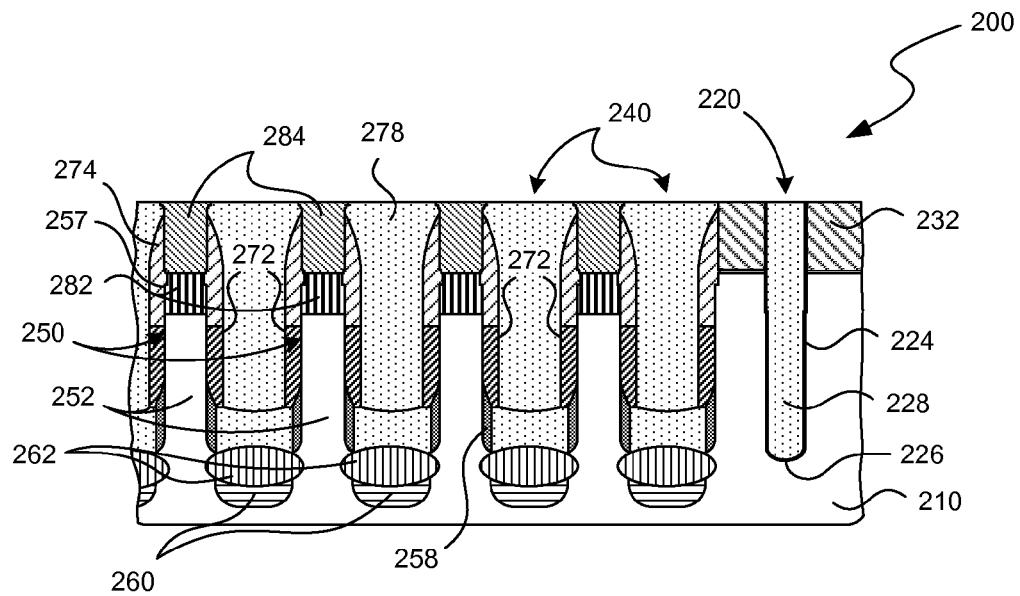
FIG. 14 is a cross-sectional view of an embodiment of a substrate at another stage of a method for forming an array of memory cells in accordance with the technology.

FIG. 14 is a cross-sectional view illustrating embodiments of an additional stage of the method 100 in which a plurality of drain contact plugs 284 are formed in the openings 280 (FIG. 13). The drain contact plugs 284 can be formed by depositing a metal or other suitably conductive material into the openings 280 (FIG. 13), and then removing an overburden portion of the metal from the top of the oxide 278 using a chemical-mechanical planarization or other process. The drain contact plugs 284, for example, can be tungsten or other suitable metals. The drain contact plugs 284 are accordingly mask-less, self-aligned features that are aligned with the semiconductor posts 252. At this point, the structure of each pillar 250 defines a memory cell, and the array of memory cells is ready for cell integration into a PCRAM or other type of memory device.

Several embodiments of the method 100 and the resulting substrate 200 can be used to form very small cross-point memory cells. Some of the smallest features of a cross-point cell array are the gate lines and the contact plugs, and current photolithographic processes may not be able to efficiently form these features at the smallest sizes. The specific embodiment of the method 100 shown and described above, however, enables the gate lines and contact plugs to be formed without having to form a pattern of either the gate lines or the contact plugs using photolithography. This not only eliminates the process errors that can be induced by photolithographically patterning very small features, but is also reduces the utilization of expensive photolithography equipment. Therefore, several embodiments of the method 100 and substrate 200 provide a cost effective process for fabricating cross-point memory cells.

Several embodiments of the method 100 and the substrate 200 also provide a structure that can address other concerns of cross-point memory cells. For example, because the gate lines 272 surround the intermediate sections 256b of the semiconductor posts 252 along a column of pillars 250, the issues of reversed leakage current, serial resistance along a column of pillars 250, and current-voltage control are expected to be mitigated.

Figure 15:
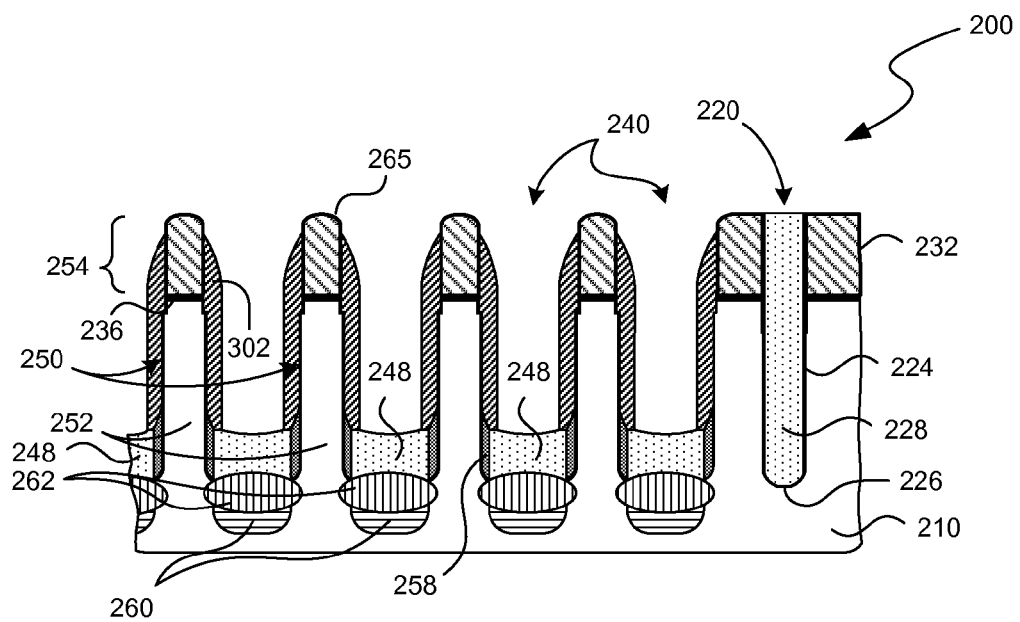
FIG. 15 is a cross-sectional view of an embodiment of a substrate at another stage of a method for forming an array of memory cells in accordance with the technology.

FIGS. 15-22 illustrate stages of another embodiment of the method 100. FIG. 15 is a cross-sectional view that illustrates a stage immediately after the stages described above with respect to FIGS. 2A-9C. FIG. 15, more specifically, illustrates a stage of another embodiment of the process 100 in which the gate material 270 has been spacer etched to selectively stop on the gate dielectric 265 and the oxide 248. The process illustrated in FIG. 15 differs from that illustrated in FIG. 10 in that the gate material 270 shown in FIG. 15 is not etched to the same extent as it is in FIG. 10. The stage illustrated in FIG. 15 accordingly forms an intermediate structure 302 for forming gate lines that surround the individual pillars 250. In several embodiments, the gate lines 272 completely surround the individual pillars 250.

Figure 16:
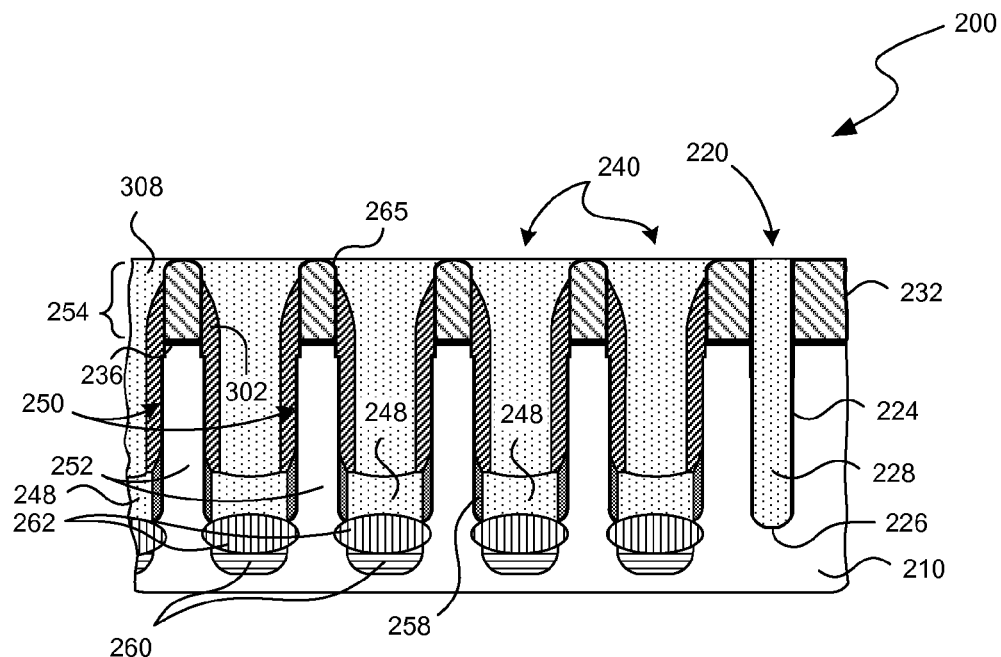
FIG. 16 is a cross-sectional view of an embodiment of a substrate at another stage of a method for forming an array of memory cells in accordance with the technology.

FIG. 16 is a cross-sectional view illustrating embodiments at a later stage in which an oxide 308 is deposited into the open portions of the column trenches 240. At this stage an overburdened portion of the oxide 308 is removed using a chemical-mechanical planarizing procedure or other process that stops on the first sacrificial material 232. The removal procedure accordingly removes portions of the gate dielectric 265 from the top surface of the remaining portions of the first sacrificial material 232 in alignment with the individual pillars 250.

Figure 17:
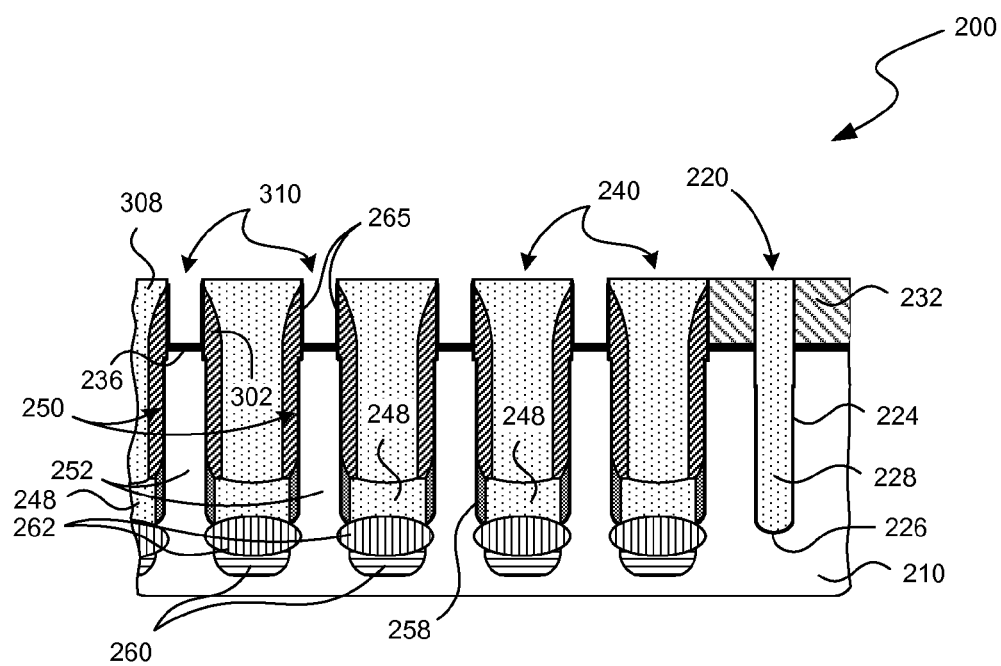
FIG. 17 is a cross-sectional view of an embodiment of a substrate at another stage of a method for forming an array of memory cells in accordance with the technology.
Figure 18:
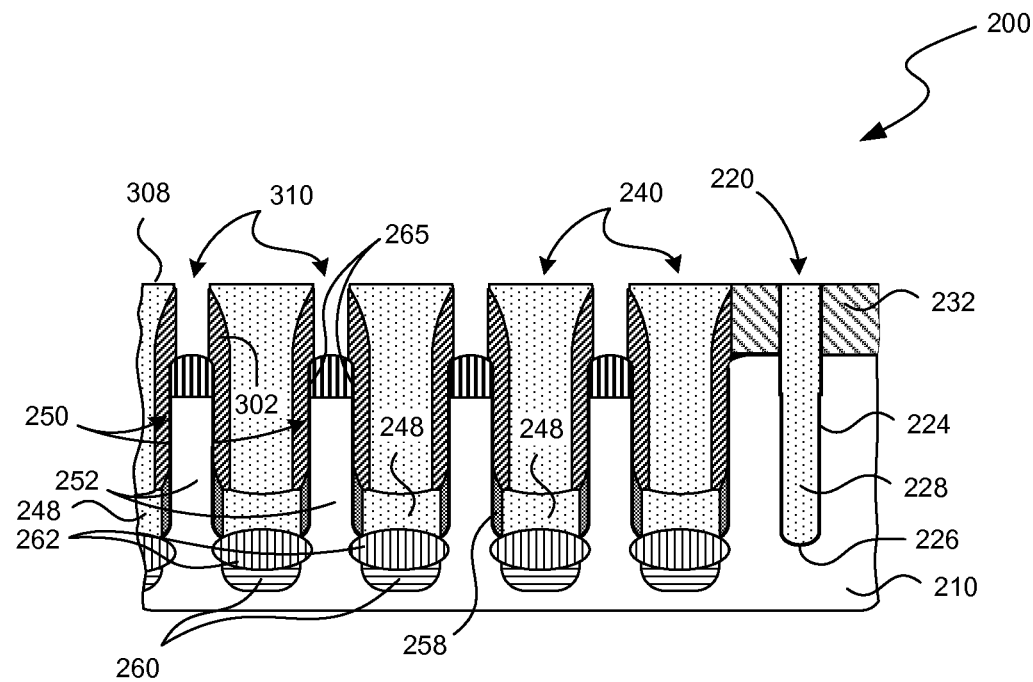
FIG. 18 is a cross-sectional view of an embodiment of a substrate at another stage of a method for forming an array of memory cells in accordance with the technology.

FIG. 17 is a cross-sectional view illustrating subsequent stages in which the remaining portions of the first sacrificial material 232 are removed from the regions over the pillars 250 to form self-aligned openings 310 aligned with corresponding pillars 250. The first sacrificial material 232 can be selectively removed such that the remaining portions of the gate dielectric 265 remain intact. FIG. 18 is a cross-sectional view that shows a subsequent stage in which the remaining portions of the gate dielectric 265 are removed to expose the distal portions 256c of the semiconductor posts 252. At this point a desired implant species can be implanted into the distal portions 256 of the semiconductor posts 252 to form drain regions 282.

Figure 19:
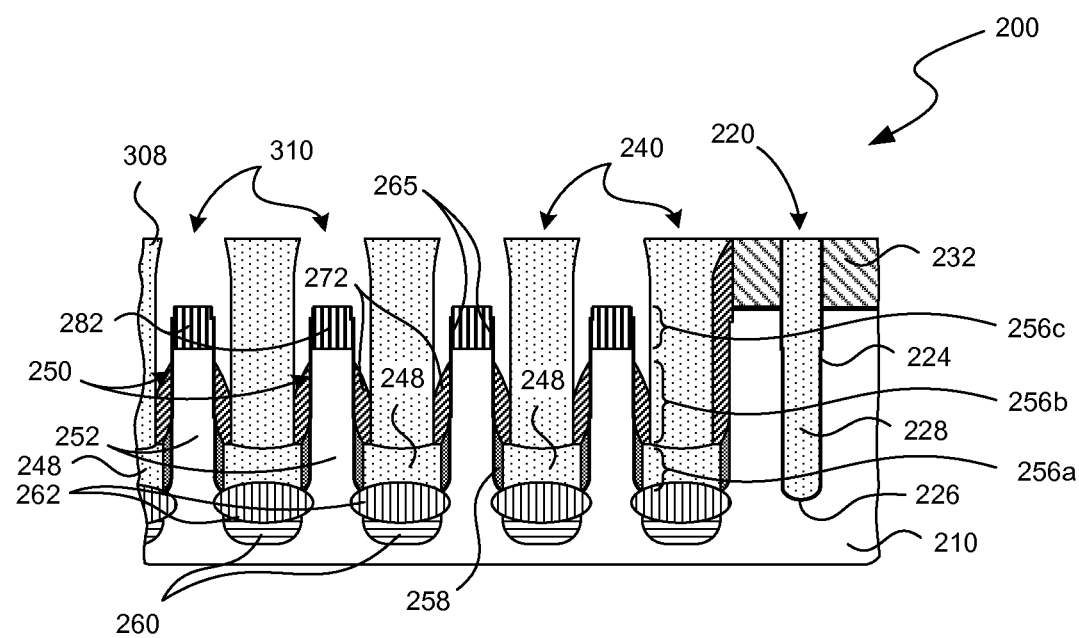
FIG. 19 is a cross-sectional view of an embodiment of a substrate at another stage of a method for forming an array of memory cells in accordance with the technology.

FIG. 19 is a cross-sectional view illustrating a subsequent stage that includes removing a portion of the intermediate structure 302 to form the individual gate lines 272 at the intermediate sections 256b of corresponding semiconductor posts 252. The gate lines 272 are formed such that they are spaced apart from both the drain regions 282 and the source regions 260. The gate lines 272 also surround the intermediate sections 256b of the semiconductor posts 252 along a corresponding column of the pillars 250 as described above with respect to FIG. 10.

Figure 20:
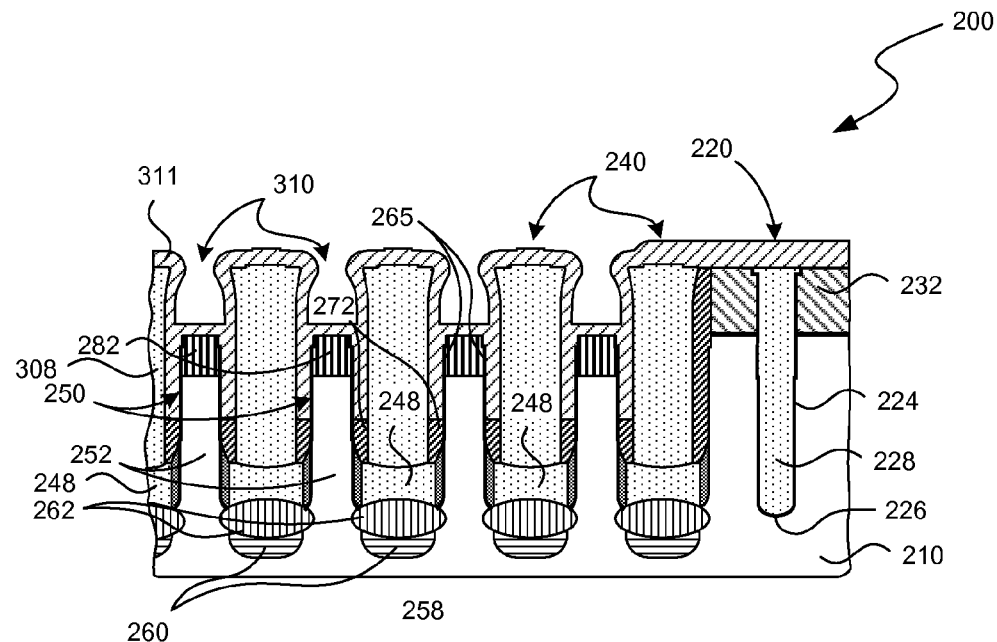
FIG. 20 is a cross-sectional view of an embodiment of a substrate at another stage of a method for forming an array of memory cells in accordance with the technology.
Figure 21:
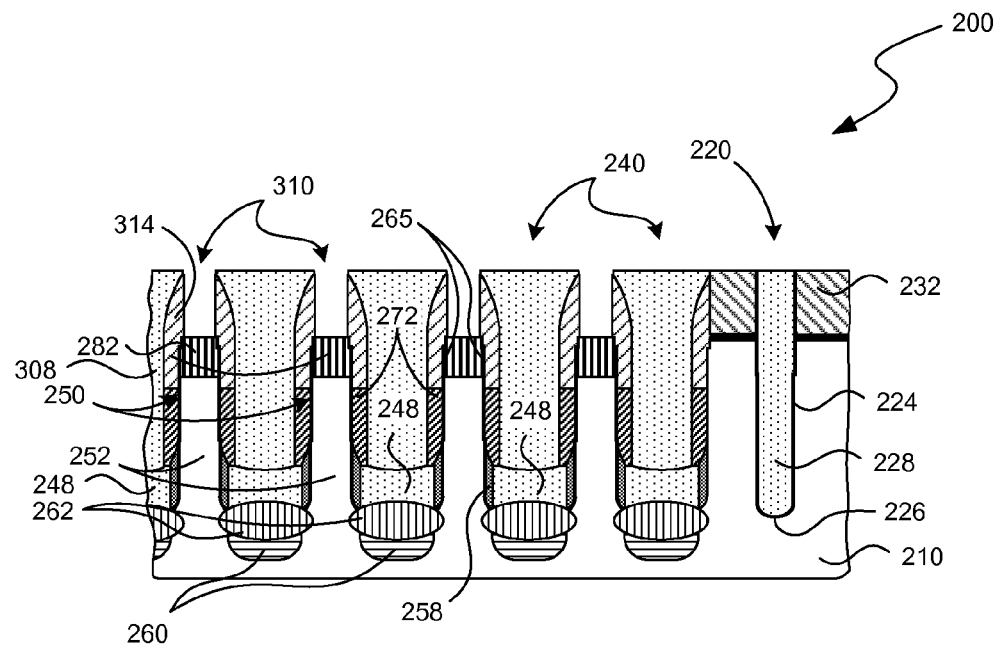
FIG. 21 is a cross-sectional view of an embodiment of a substrate at another stage of a method for forming an array of memory cells in accordance with the technology.
Figure 22:
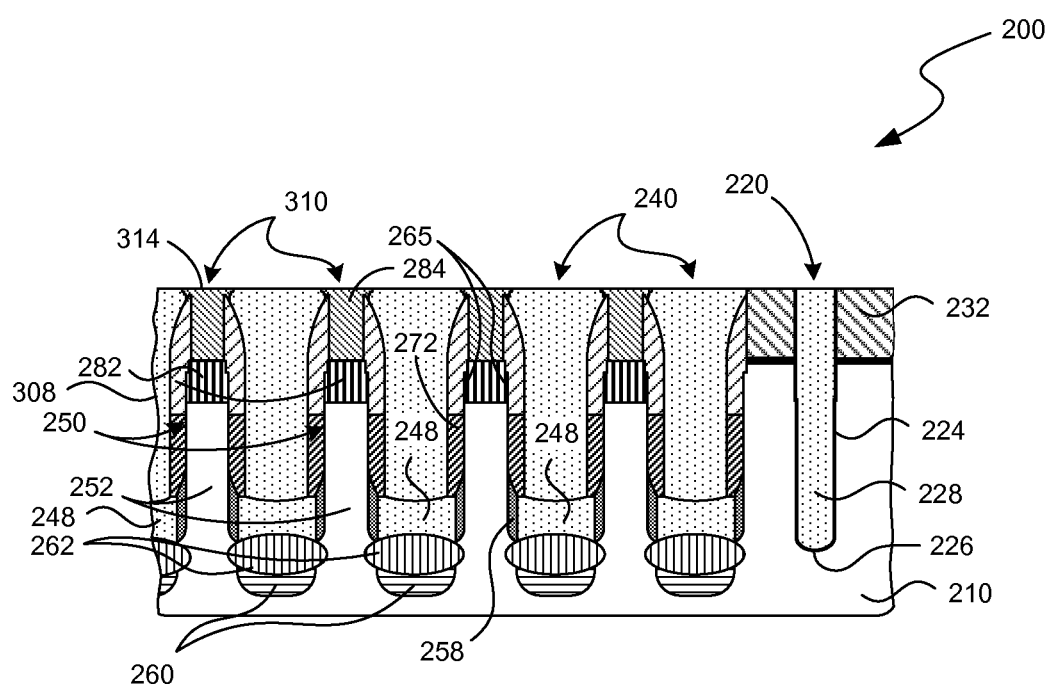
FIG. 22 is a cross-sectional view of an embodiment of a substrate at another stage of a method for forming an array of memory cells in accordance with the technology.

FIGS. 20-22 are cross-sectional views illustrating additional stages of this embodiment of the method. FIG. 20 illustrates a stage in which a dielectric spacer 311 is deposited or otherwise formed in the substrate 200. The dielectric spacer 311 can be a nitride, and the thickness of the dielectric spacer 311 can be selected to fill the gaps where the gate metal was recessed to form the gate lines 272. FIG. 21 illustrates spacer etching the dielectric spacer 311 to expose the drain regions 282. More specifically, the dielectric spacer 311 can be spacer etched to form dielectric spacers 314 above the gate lines 272 and along the sidewalls of the oxide 308. The drain regions 282 are accordingly exposed. FIG. 22 illustrates the substrate 200 at a subsequent stage in which contact plugs 284 are formed in the openings over the drain regions 282.

Figure 23:
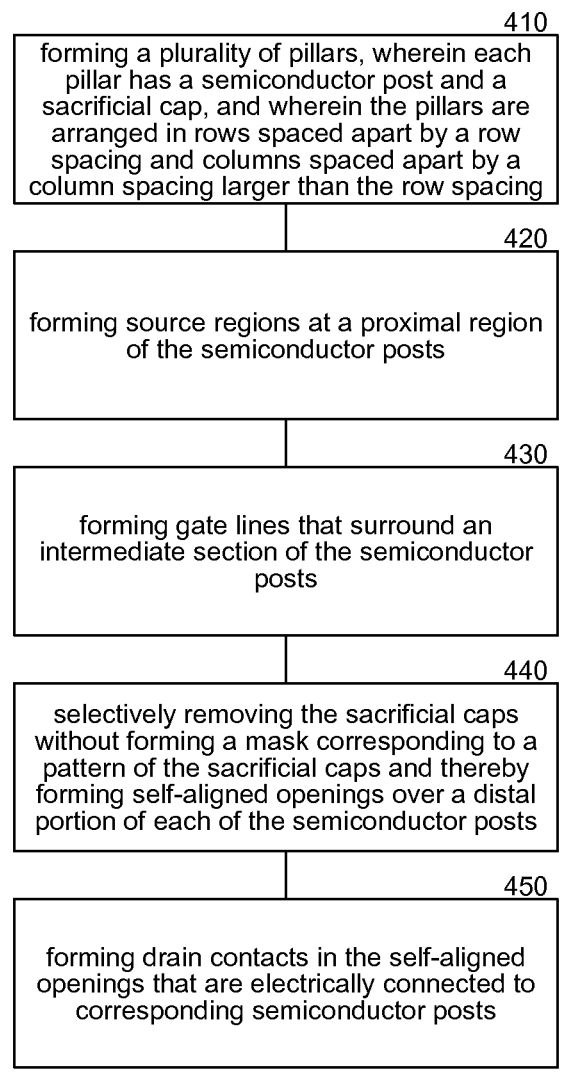
FIG. 23 is a flow chart of another embodiment of a method for forming vertical memory cells in accordance with the technology.

FIG. 23 is a flow chart of a method 400 for forming an array of vertical memory cells in accordance with another embodiment of the technology. In one embodiment, the method 400 includes forming a plurality of pillars (block 410) in which each pillar has a semiconductor post and a sacrificial cap. The pillars are arranged in rows spaced apart by a row spacing and columns spaced apart by a column spacing larger than the row spacing. The method 400 can further include forming source regions at a proximal region of the semiconductor posts (block 420) and forming conductive gate lines that completely surround an intermediate section of the semiconductor posts in a corresponding column of pillars (block 430). After forming the gate lines, the sacrificial caps can be removed selectively without forming a photo-pattern corresponding to a pattern of the sacrificial caps and thereby forming self-aligned openings over a distal portion of each of the semiconductor posts (block 440). The method 400 can also include forming drain contacts in the self-aligned openings that are electrically connected to corresponding semiconductor posts (block 450).

From the foregoing, it will be appreciated that specific embodiments of the invention have been described herein for purposes of illustration, but well-known structures and functions have not been shown or described in detail to avoid unnecessarily obscuring the description of the embodiments of the invention. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of features are not precluded Accordingly, the invention is not limited except as by the appended claims.

We claim:

1. A method of forming an array of memory cells, comprising:
   forming a plurality of pillars, wherein individual pillars have a semiconductor post formed of a semiconductor material and a sacrificial cap on the semiconductor post;
   forming source regions between columns of the pillars;
   forming a plurality of gate lines, wherein individual gate lines extend along a corresponding column of pillars and are spaced apart from corresponding source regions, and wherein each gate line surrounds a portion of the semiconductor posts along a corresponding column of pillars;
   forming self-aligned openings that expose a top portion of corresponding semiconductor posts by selectively removing the sacrificial caps without forming a mask having a pattern of openings corresponding to the pattern of the self-aligned openings; and
   forming individual drain contacts in the self-aligned openings that are electrically connected to corresponding semiconductor posts.

2. The method of claim 1 wherein:
   forming the pillars comprises fabricating a shallow trench isolation structure having array trenches and an oxide in the array trenches, forming a column trench mask, and etching column trenches in the semiconductor material that space apart the columns of the pillars;
   forming the source region comprises implanting an N-type implant into the semiconductor material at a bottom of the column trenches; and
   forming the gate lines comprises filling the column trenches with an oxide, etching the oxide in the array trenches and the column trenches to a depth spaced apart from the source regions, depositing a metal into the array trenches and the column trenches such that the metal fills the array trenches but does not fill the column trenches, and spacer etching the metal to a level spaced apart from the sacrificial caps.

3. The method of claim 1 wherein forming the pillars comprises fabricating a shallow trench isolation structure having array trenches and an oxide in the array trenches and etching column trenches in the semiconductor material transverse to the array trenches.

4. The method of claim 3 wherein the array trenches have a first width and the column trenches have a second width greater than the first width.

5. The method of claim 1 wherein the pillars in individual columns are spaced apart by gaps, and wherein the columns of the pillars are spaced apart by spaces larger than the gaps.

6. The method of claim 1 wherein the sacrificial caps comprise a first sacrificial material and a second sacrificial material, wherein the first and second sacrificial materials are selectively removable relative to each other.

7. The method of claim 1 wherein the pillars are spaced apart from each other by array trenches between the pillars and column trenches.

8. The method of claim 7 wherein forming the gate lines comprises depositing a metal into the array trenches and the column trenches such that the metal completely surrounds at least an intermediate section of each of the posts.

9. The method of claim 8, further comprising spacer etching the metal, forming a dielectric spacer material over the metal gate structures and the pillars, spacer etching the dielectric spacer material, and filling the column trenches with an oxide, removing a portion of the oxide to expose portions of the sacrificial caps, wherein selectively removing the sacrificial caps comprises selectively etching the sacrificial caps relative to the oxide.

10. The method of claim 9 wherein the oxide is removed by chemical-mechanical planarization.

11. The method of claim 9, further comprising implanting a drain into a top portion of each semiconductor post before forming the drain contacts.

12. The method of claim 1, further comprising directly implanting a drain into a distal portion of each semiconductor posts through the self-aligned openings.

13. A method of forming an array of vertical memory cells, comprising:
    forming a plurality of pillars, wherein each pillar has a semiconductor post and a sacrificial cap, and wherein the pillars are arranged in rows spaced apart by a row spacing and columns spaced apart by a column spacing larger than the row spacing;
    forming source regions at a proximal region of the semiconductor posts;
    forming gate lines that surround an intermediate section of the semiconductor posts;
    selectively removing the sacrificial caps without forming a mask corresponding to a pattern of the sacrificial caps and thereby forming self-aligned openings over a distal portion of each of the semiconductor posts; and
    forming drain contacts in the self-aligned openings that are electrically connected to corresponding semiconductor posts.

14. The method of claim 13 wherein forming the pillars comprises fabricating a shallow trench isolation structure having array trenches and an oxide in the array trenches and etching column trenches in the semiconductor material transverse to the array trenches.

15. The method of claim 14 wherein forming the gate lines comprises depositing a metal having a thickness into the array trenches and the column trenches such that the metal fills the array trenches but does not fill the column trenches, and spacer etching the metal to a level spaced apart from the sacrificial caps.

16. The method of claim 15 wherein the array trenches have a first width less than twice the thickness of the metal and the column trenches have a second width greater than the first width.

17. The method of claim 13 wherein selectively removing the sacrificial cap comprises planarizing a first sacrificial material and then etching a second sacrificial material.

18. The method of claim 13 wherein the sacrificial caps comprise a first sacrificial material and a second sacrificial material, wherein the first and second sacrificial materials are selectively removable relative to each other.

19. The method of claim 15, further comprising spacer etching the metal, forming a dielectric spacer material over the metal gate structures and the pillars, spacer etching the dielectric spacer material, filling the column trenches with an oxide, removing a portion of the oxide to expose portions of the sacrificial caps, and wherein selectively removing the sacrificial caps comprises selectively etching the sacrificial caps relative to the oxide.

20. The method of claim 13, further comprising implanting a drain into a top portion of each semiconductor post before forming the drain contacts.

\* \* \* \* \*